(12) United States Patent
Song

(10) Patent No.: US 6,850,291 B2
(45) Date of Patent: Feb. 1, 2005

(54) METHOD OF FABRICATING LIQUID CRYSTAL DISPLAY DEVICE

(75) Inventor: In Duk Song, Kumi-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 9 days.

(21) Appl. No.: 10/621,328

(22) Filed: Jul. 18, 2003

(65) Prior Publication Data

US 2004/0018669 A1 Jan. 29, 2004

Related U.S. Application Data

(62) Division of application No. 10/278,931, filed on Oct. 24, 2002, now Pat. No. 6,650,380.

(30) Foreign Application Priority Data

Dec. 20, 2001 (KR) ...................................... P2001-81774

(51) Int. Cl.[7] ........................ G02F 1/136; G02F 1/1333
(52) U.S. Cl. ............................ 349/43; 349/138; 349/46; 257/59; 257/72
(58) Field of Search ........................... 349/43, 46, 138, 349/187; 257/59, 72

(56) References Cited

U.S. PATENT DOCUMENTS

| | | | | |
|---|---|---|---|---|
| 5,541,748 A | * | 7/1996 | Ono et al. ...................... | 349/42 |
| 5,763,899 A | * | 6/1998 | Yamazaki et al. ............. | 257/59 |
| 5,883,682 A | * | 3/1999 | Kim et al. ..................... | 349/43 |
| 5,905,555 A | | 5/1999 | Yamazaki et al. | |
| 6,104,461 A | | 8/2000 | Zhang et al. | |
| 6,160,600 A | | 12/2000 | Yamazaki et al. | |
| 6,330,042 B1 | * | 12/2001 | Kang et al. .................... | 349/43 |
| 6,630,686 B1 | * | 10/2003 | Kim ............................. | 257/72 |

\* cited by examiner

*Primary Examiner*—Toan Ton
(74) *Attorney, Agent, or Firm*—Birch, Stewart, Kolasch & Birch, LLP

(57) ABSTRACT

A method of fabricating a liquid crystal display device, includes forming a gate electrode and a gate pad over a substrate; forming a gate insulating film over the substrate; forming a semiconductor layer over the gate insulating film; forming a source electrode, a drain electrode and a data pad over the gate insulating film; depositing an inorganic insulating material on the gate insulating film; depositing an organic insulating material over the inorganic insulating material; removing selectively the organic insulating material at a partial area over the drain electrode, the gate pad and the data pad, to leave a portion of the organic insulating material over the gate pad and the data pad; patterning the gate insulating film and the inorganic insulating material using at least a portion of the remaining organic insulating material as a mask, thereby providing an inorganic protective film, an organic protective film, a drain contact hole, a gate contact hole and a data contact hole; and forming a pixel electrode on the inorganic protective film by depositing a transparent conductive film onto the inorganic protective film and the organic protective film and patterning the transparent conductive film, and forming a gate protective electrode and a data protective electrode on the inorganic protective film.

8 Claims, 10 Drawing Sheets

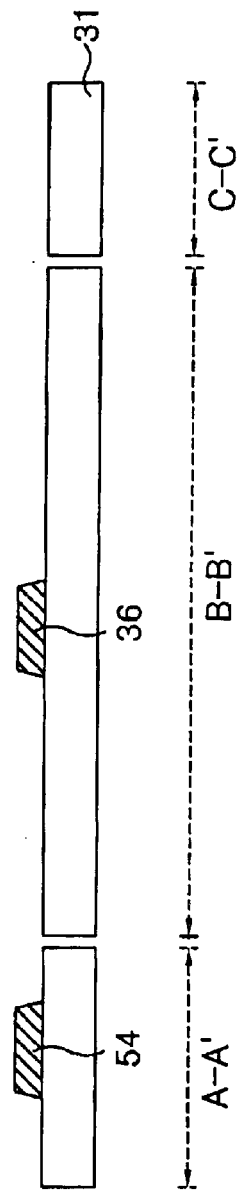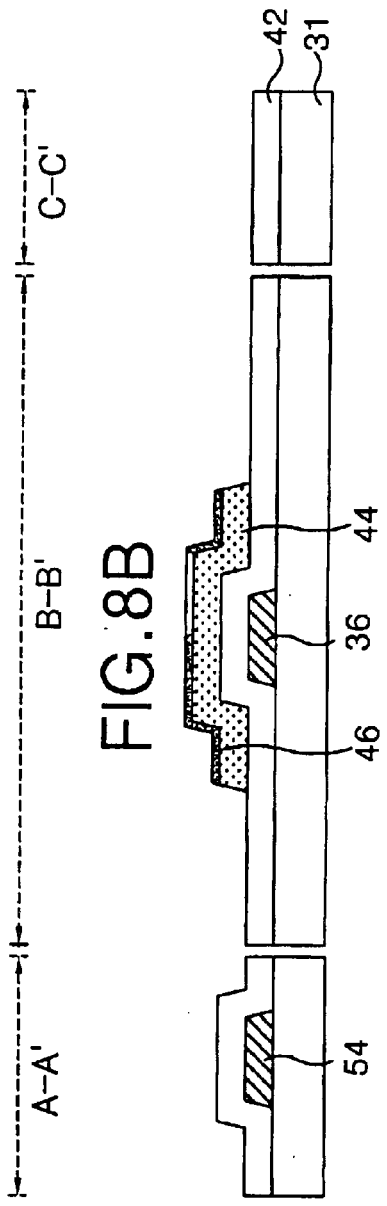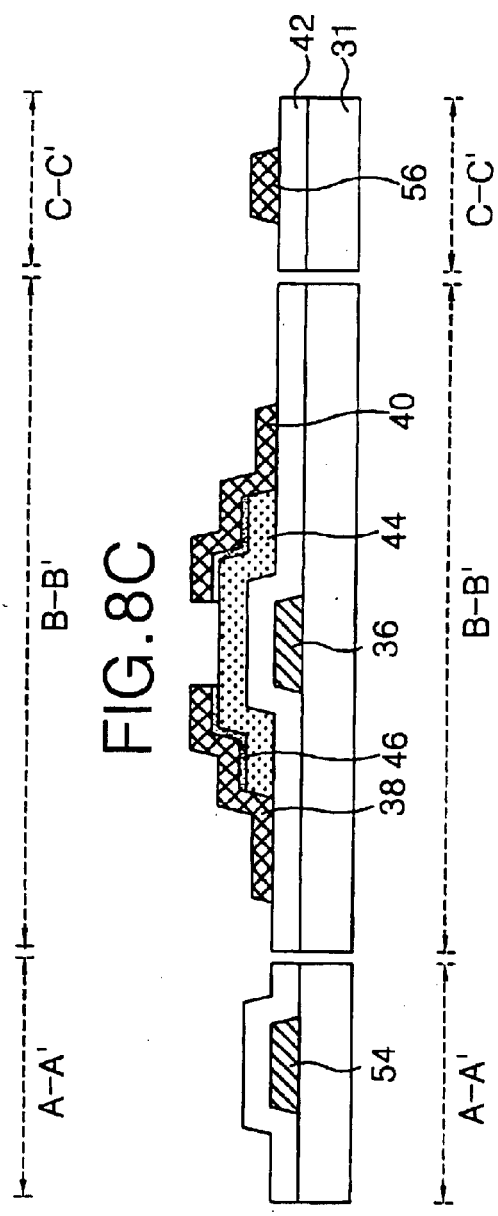

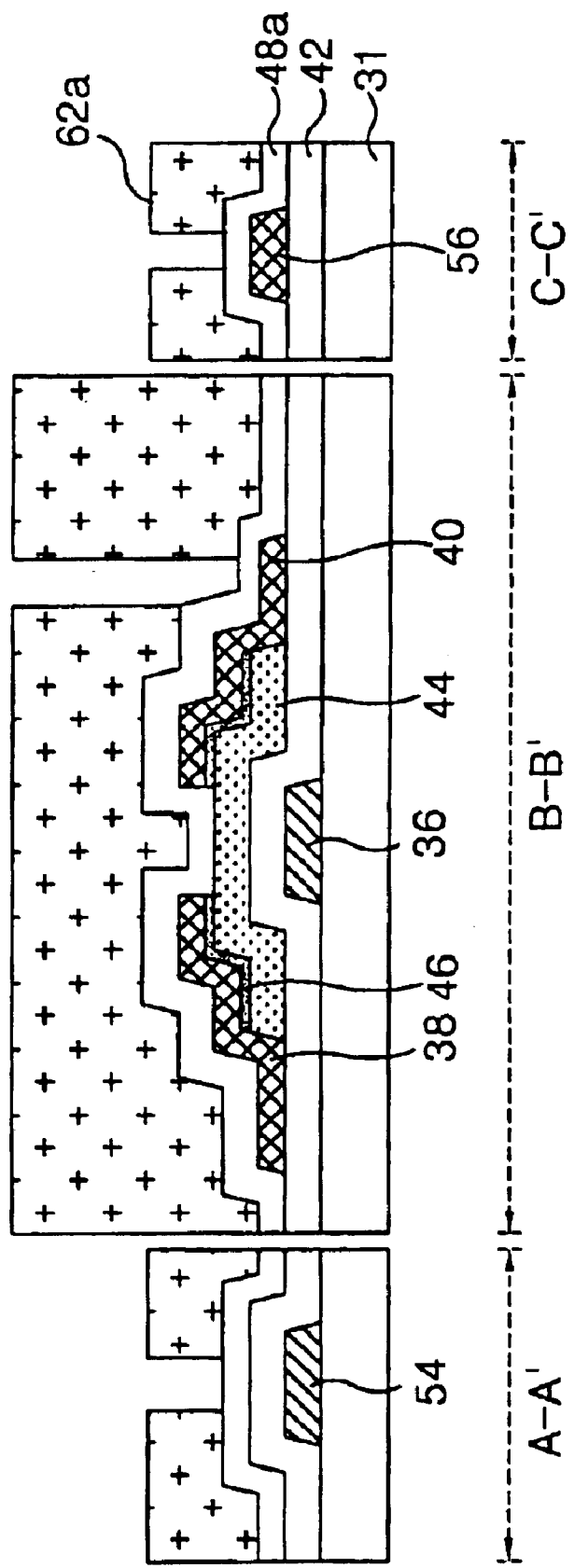

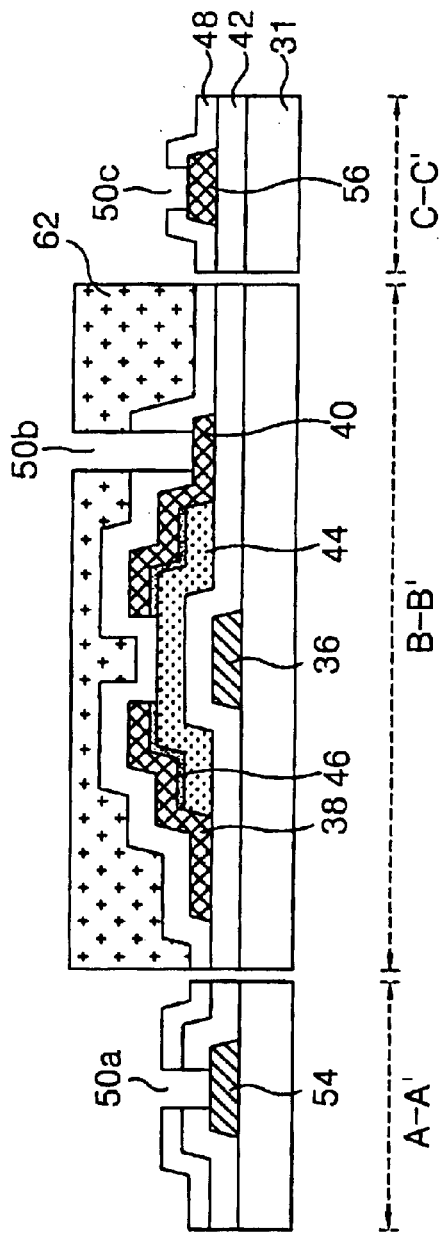
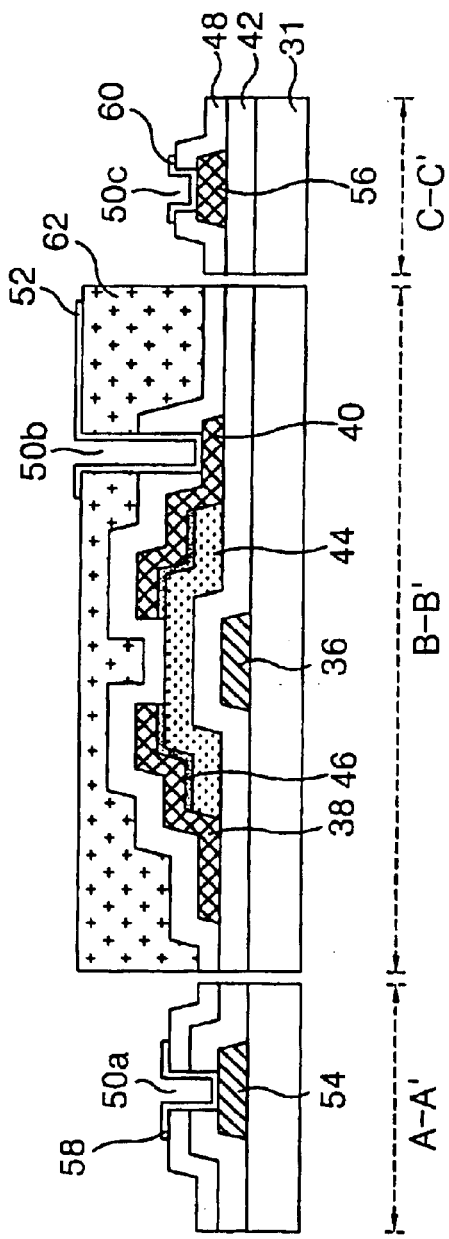

METHOD OF FABRICATING LIQUID CRYSTAL DISPLAY DEVICE

This application is a divisional of Application Ser. No. 10/278,931, filed on Oct. 24, 2002, now U.S. Pat. No. 6,650,380 the entire contents of which are hereby incorporated by reference and for which priority is claimed under 35 U.S.C. §120; and this application claims priority of Application No. 2001-0081774 filed in Korea on Dec. 20, 2001 under 35 U.S.C. §119.

The present application claims, under 35 U.S.C §119, the benefit of Korean Patent Application No. P2001-081774 filed Dec. 20, 2001, which is herein fully incorporated by reference.

BACKGROUND OF THE INVENTION

1. Field of the Invention

This invention pertains to a liquid crystal display, and more particularly to a method of fabricating a liquid crystal display device that has improved yield.

2. Description of the Related Art

Generally, a liquid crystal display (LCD) controls the light transmissivity of liquid crystal cells arranged in a matrix pattern in response to a video signal to thereby display a picture corresponding to the video signals on a liquid crystal display panel. To this end, the LCD includes a liquid crystal display panel having liquid crystal cells arranged in an active matrix, and driving integrated circuits (IC's) drive the liquid crystal cells.

The driving IC's are usually manufactured in chip form. The driving IC's are mounted on a tape carrier package (TCP) film attached to the outer periphery of the liquid crystal panel. The driving IC's are connected by a tape automated bonding (TAB) system while being mounted along the edge of the liquid crystal panel, when they are connected by a chips on glass (COG) system. In the TAB system, the driving IC's are electrically connected to a pad portion provided at the liquid crystal panel by means of the TCP.

FIG. 1 is a plan view showing a structure of a conventional LCD device.

In FIG. 1, the LCD device has a lower plate 4 and an upper plate 6 that oppositely adhere to each other. The LCD device includes a picture display part 2 having liquid crystal cells arranged in a matrix pattern, and gate pad portions GP and data pad portions DP connected between the driving IC's and the picture display part 2.

In the picture display part 2, data lines supplied with data signals and gate lines supplied with gate signals are arranged at the lower plate 4 so as to cross each other. Each of the crossing parts is provided with a thin film transistor for switching the liquid crystal cell, and a pixel electrode connected to the thin film transistor drives the liquid crystal cell. The upper plate 6 includes coated color filters, and the color filters are separated for each cell area by black matrices. A common transparent electrode is coated on the surfaces of the color filters. Upper and lower plates 6 and 4 are spaced from each other by a spacer to provide a cell gap, which is filled with a liquid crystal material. The upper and lower plates 6 and 4 adhere to each other by means of a sealant coated on a seal 10 at the outside of the picture display part 2.

The edge area of the lower plate 4 that does not overlap with the upper plate 6 is provided with gate pad portions GP and data pad portions DP. The gate pad portion GP applies a gate signal from the gate driving IC to the gate line of the picture display part 2. The data pad portion DP applies a video signal from the data driving IC to the data line of the picture display part 2.

In the LCD device having the structure described above, a protective film for protecting the metal electrode and the thin film transistors entirely coats the lower plate 4. The pixel electrode is formed on the protective film for each cell area. The protective film is an organic protective film that enhances the aperture ratio of the pixel.

As shown in FIG. 2, a gate pad 14 of the gate pad portion GP along with a gate line of the picture display part 2 is provided on a lower substrate 1. A gate insulating film 22 and an organic protective film 24 are sequentially entirely coated on the lower substrate 1 to cover the gate pad 14. A gate contact hole 16a forms by patterning the gate insulating film 22 and the organic protective film 24 to expose a portion of the gate pad 14. A gate protective electrode 20 is formed on the organic protective film 24 to electrically connect the gate pad 14 to the gate protective electrode 20 via the gate contact hole 16a.

As shown in FIG. 3, a data pad 18 of the data pad part DP along with a data line of the picture display part 2 are provided on the gate insulating film 22. The organic protective film 24 entirely coats the gate insulating film 22 to cover the data pad 18. A data contact hole 16b forms by patterning the organic protective film 24 to expose a portion of the data pad 18. A data protective electrode 26 formed on the organic protective film 24 is electrically connected, via the data contact hole 16b, to the data pad 18.

The gate pad portion GP and the data pad portion DP are in contact with the TCP mounted with the driving IC by the TAB system. The gate pad 14 and the data pad 18 are electrically connected to the TCP via the gate protective electrode 20 and the data protective electrode 26 provided on the organic protective film 24. This has the goal of preventing damage to the gate pad 14 and the data pad 18 upon repetition of the TCP adhering process required for the TAB system. Also, the gate pad 14 and the data pad 18 are not exposed and hence do not react with peripheral moisture to cause their oxidative corrosion.

In order to electrically connect the TCP to the gate protective electrode 20 and the data protective electrode 26, an anisotropic conductive film 12 as shown in FIG. 4A and FIG. 4B is provided. The anisotropic conductive film 12 is coated with conductive particles 28, which form a current path between the TCP, the gate protective electrode 20 and the data protective electrode 26.

If the data pad portion DP and the gate pad portion GP adhere to the TCP mounted with the driving IC by the TAB system, then it is necessary to repeat the process of adhesive bonding and separating the TCP many times when defects caused by a misalignment occur. Accordingly, as the organic protective film 24 has a weak adhesion characteristic with respect to the gate insulating film 22, it is removed along with the TCP in the process of separating the TCP. In this case, there is a problem in that unevenness of the surface removed with the organic protective film 24 causes a weak adhesion characteristic upon re-adhering the TCP.

Furthermore, if the organic protective film 24 on the gate pad 14 and the data pad 18 is removed, then the gate protective electrode 20 and the data protective electrode 26 thereon also are removed. Accordingly, there is a problem in that the gate pad 14 and the data pad 18 are exposed to be damaged or oxidized, thereby deteriorating the characteristics of the gate pad 14 and the data pad 18.

Moreover, if a mask for eliminating the residual organic protective film 24 is used for a smooth repair process, then the productivity is reduced and hence a production time is prolonged.

SUMMARY OF THE INVENTION

Accordingly, it is an object of the invention to provide a method of fabricating a liquid crystal display device that is adapted to improve the yield and overcome problems and disadvantages of the related art.

A method of fabricating a liquid crystal display device according to an embodiment of the present invention, includes forming a gate electrode and a gate pad over a substrate, forming a gate insulating film over the substrate, forming a semiconductor layer over the gate insulating film, forming a source electrode, a drain electrode and a data pad over the gate insulating film, depositing an inorganic insulating material over the gate insulating film, depositing an organic insulating material over the inorganic insulating material, removing selectively the organic insulating material at a partial area over the drain electrode, the gate pad and the data pad to leave a portion of the organic insulating material over the gate pad and the data pad, patterning the inorganic insulating material using at least a portion of the remaining organic insulating material as a mask, thereby providing an organic protective film and a part of an inorganic protective film over the source and drain electrodes and a part of the inorganic protective film over the gate and data pads, and forming a transparent electrode pattern over the inorganic protective film and the organic protective film.

A method of fabricating a liquid crystal display device according to an embodiment of the present invention, includes forming a gate electrode and a gate pad over a substrate, forming a gate insulating film over the substrate, forming a semiconductor layer over the gate insulating film, forming a source electrode, a drain electrode and a data pad over the gate insulating film, depositing an inorganic insulating material on the gate insulating film, depositing an organic insulating material over the inorganic insulating material, removing selectively the organic insulating material at a partial area over the drain electrode, the gate pad and the data pad, to leave a portion of the organic insulating material over the gate pad and the data pad, patterning the gate insulating film and the inorganic insulating material using at least a portion of the remaining organic insulating material as a mask, thereby providing an inorganic protective film, an organic protective film, a drain contact hole, a gate contact hole and a data contact hole, and forming a pixel electrode on the inorganic protective film by depositing a transparent conductive film onto the inorganic protective film and the organic protective film and patterning the transparent conductive film, and forming a gate protective electrode and a data protective electrode on the inorganic protective film.

A method for forming a display device according to an embodiment of the present invention, includes forming a thin film transistor (TFT), a gate pad and a data pad on a substrate, depositing sequentially an inorganic insulating material and an organic insulating material on the substrate having the TFT, the gate pad and the data pad, selectively removing the organic insulating material using a diffracting mask to form a patterned organic insulating layer, selectively removing the inorganic insulating material, using at least a portion of the patterned organic insulating layer as a mask to define contact holes for the TFT, the gate pad and the data pad, and forming electrodes in the contact holes.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings, in which:

FIG. 8A to FIG. 8G are section views showing a method of fabricating the liquid crystal display device shown in FIG. 6 according to an embodiment of the present invention.

DETAILED DESCRIPTION OF THE PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
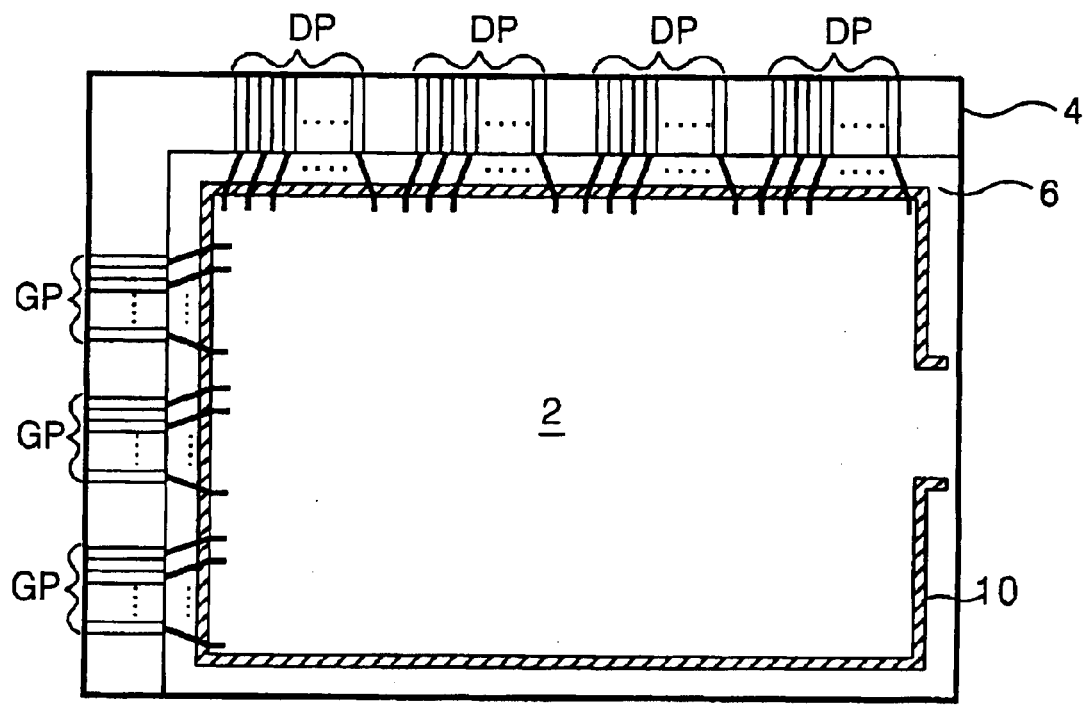
FIG. 1 is a schematic plan view showing a structure of a conventional liquid crystal display device.
Figure 2:
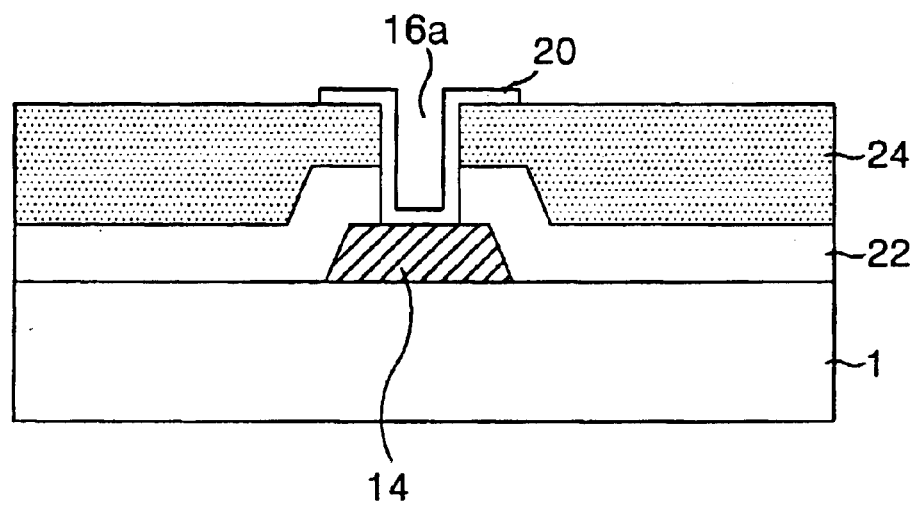
FIG. 2 is a section view of the gate pad portion shown in FIG. 1.
Figure 3:
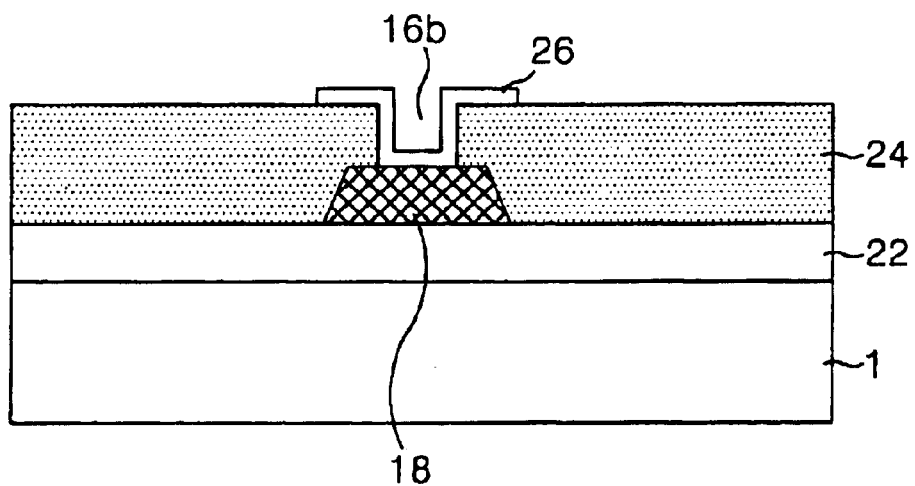
FIG. 3 is a section view of the data pad portion shown in FIG. 1.
Figure 4A:
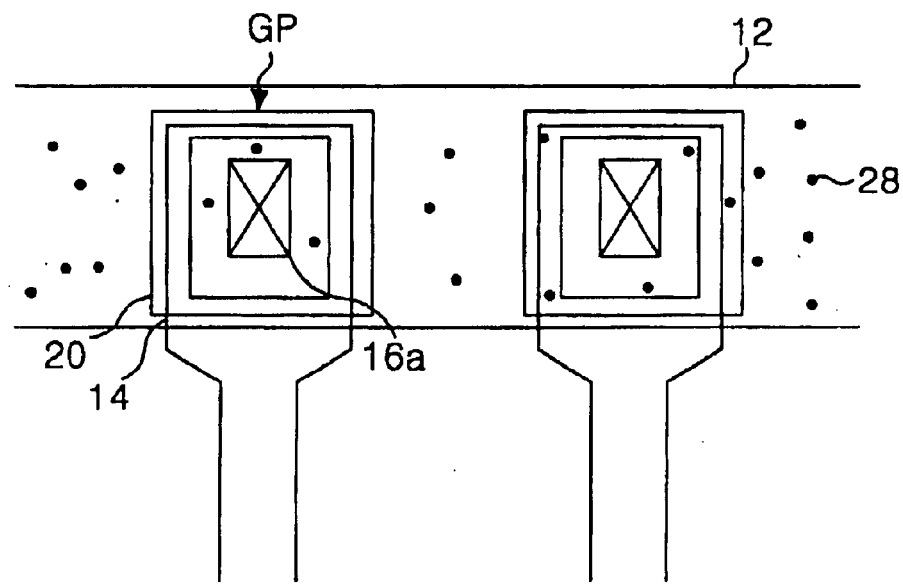
FIG. 4A and FIG. 4B illustrate anisotropic conductive films provided on the gate pad portion and the data pad portion shown in FIG. 2 and FIG. 3, respectively.
Figure 4B:
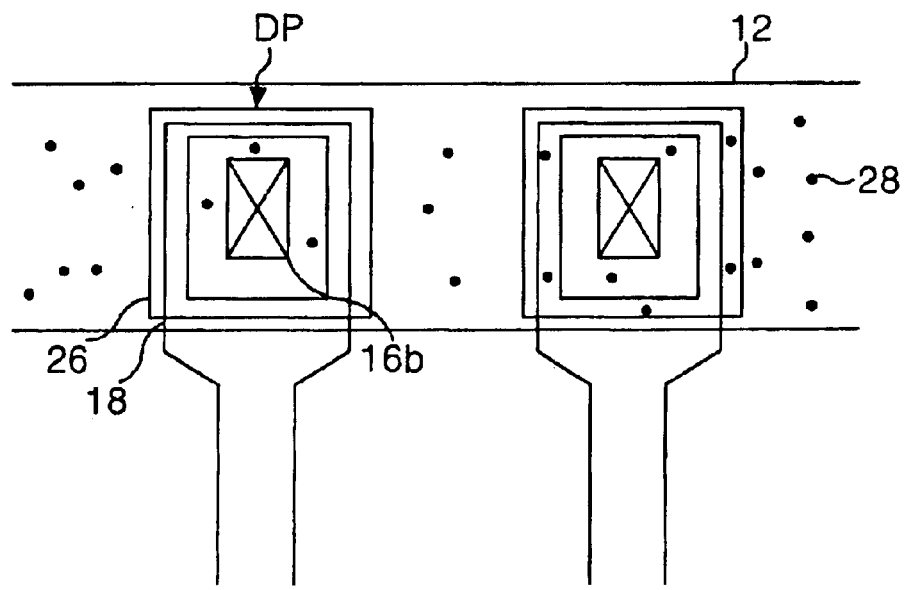
Figure 5:
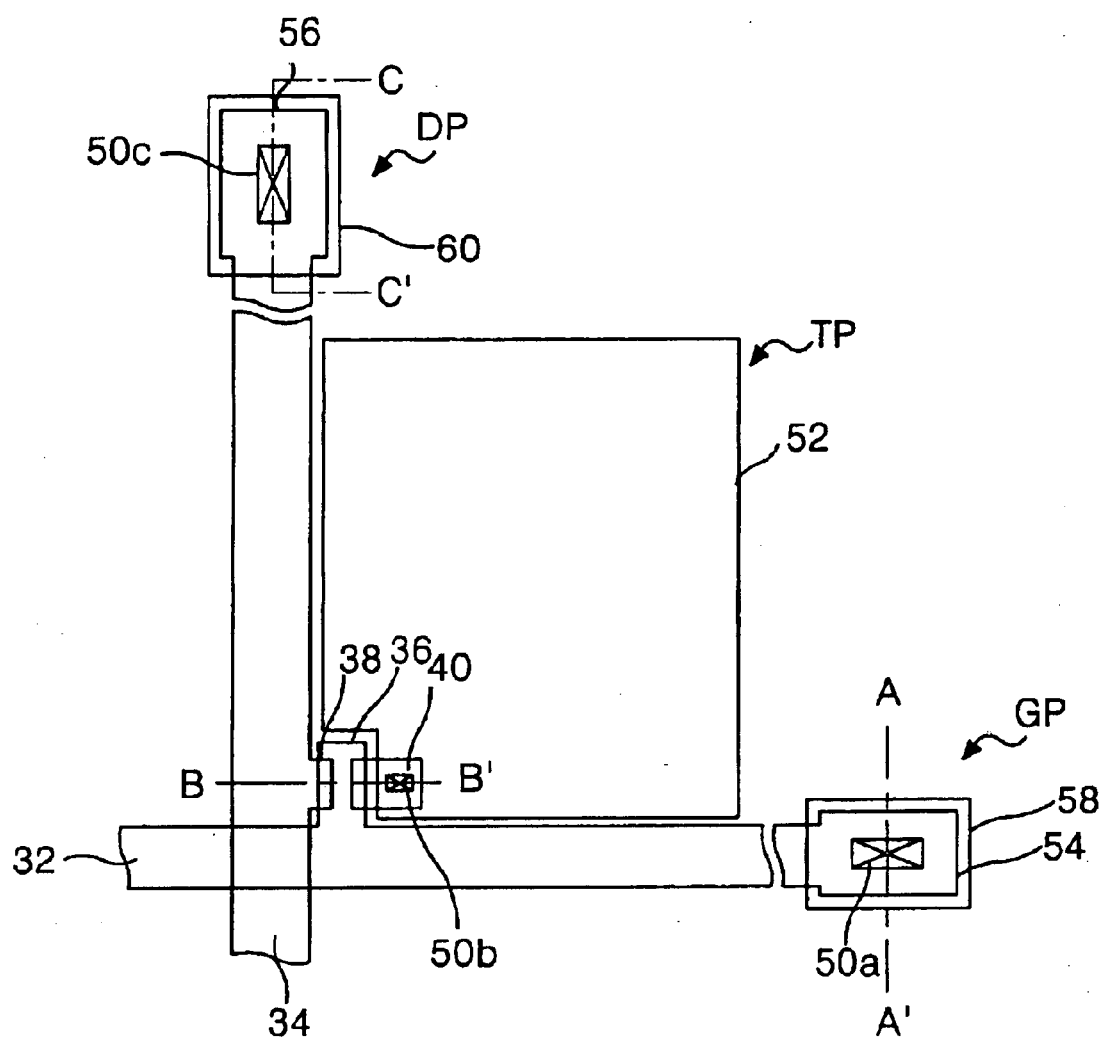
FIG. 5 is a plan view showing a structure of a liquid crystal display device according to an embodiment of the present invention.
Figure 6:
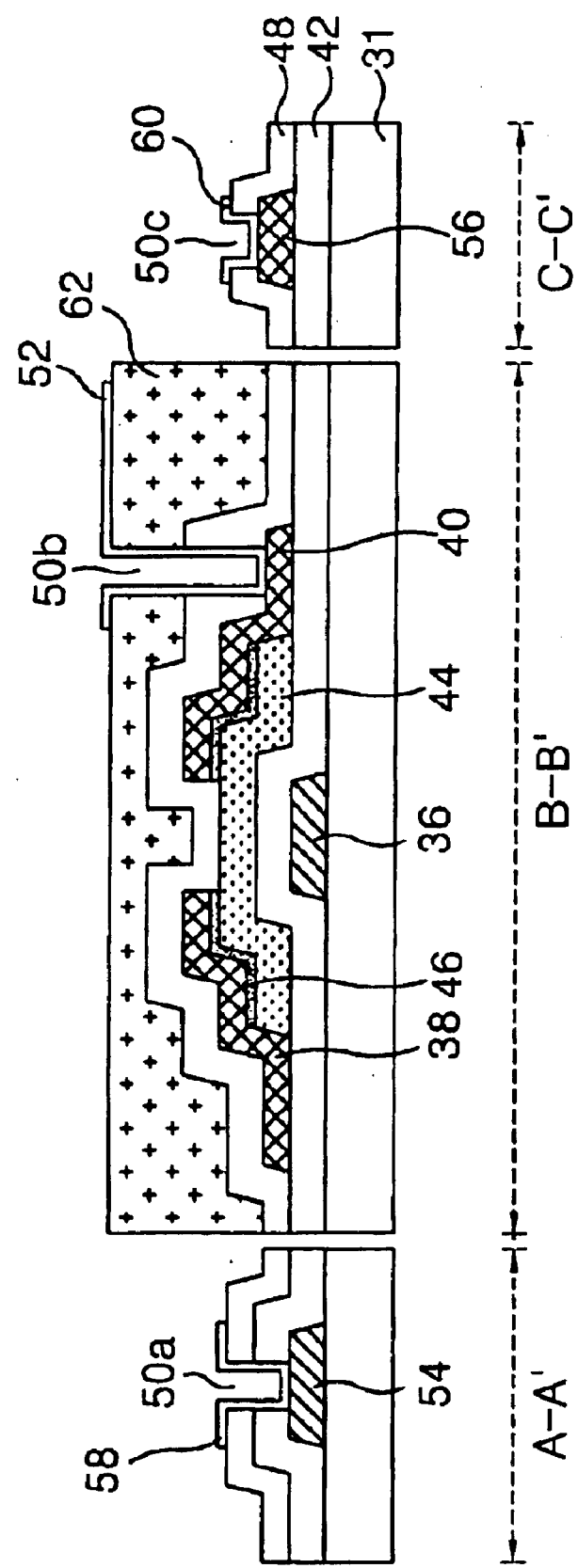
FIG. 6 is a section view of the liquid crystal display device taken along the A-A', B-B' and C-C' lines in FIG. 5.

FIG. 5 and FIG. 6 show a liquid crystal display (LCD) device according to an embodiment of the present invention.

As shown, the LCD device includes a picture display part TP having liquid crystal cells arranged in a matrix pattern. Gate pad portions GP and data pad portions DP are connected between driving IC's (not shown) and the picture display part TP.

The picture display part TP has data lines 34 supplied with data signals, and gate lines 32 supplied with gate signals are arranged at a lower plate (not shown) to cross each other. Each of the crossing parts is provided with a thin film transistor (TFT) for switching the liquid crystal cell and having a gate electrode 36, a source electrode 38 and a drain electrode 40. An inorganic protective film 48 protects the TFT, and an organic protective film 62 enhances the aperture ratio. A pixel electrode 52 in electrical contact with the drain electrode through a drain contact hole Sob is provided on the organic protective film 62 for each cell area.

The gate pad portion GP is connected to a gate driving IC (not shown) positioned at one end of the gate line 32. The gate pad portion GP applies a gate signal for controlling the TFT from the gate driving IC to the gate line 32 of the picture display part TP. The gate pad portion GP includes a gate pad 54 connected to the gate line 32, and a gate protective electrode 58 connected to the gate driving IC. The gate insulating film 42 and the inorganic protective film 48 are provided between the gate pad 54 and the gate protective electrode 58.

The data pad portion DP is connected to a data driving IC (not shown) positioned at one end of the data line 34. The data pad portion DP applies a data signal for controlling the TFT from the data driving IC to the data line 34 of the picture display part TP. The data pad portion DP includes a data pad 56 connected to the data line 34, a data protective electrode 60 connected to the data driving IC, and the inorganic protective film 48 provided between the data pad 56 and the data protective electrode 60.

Figure 7:
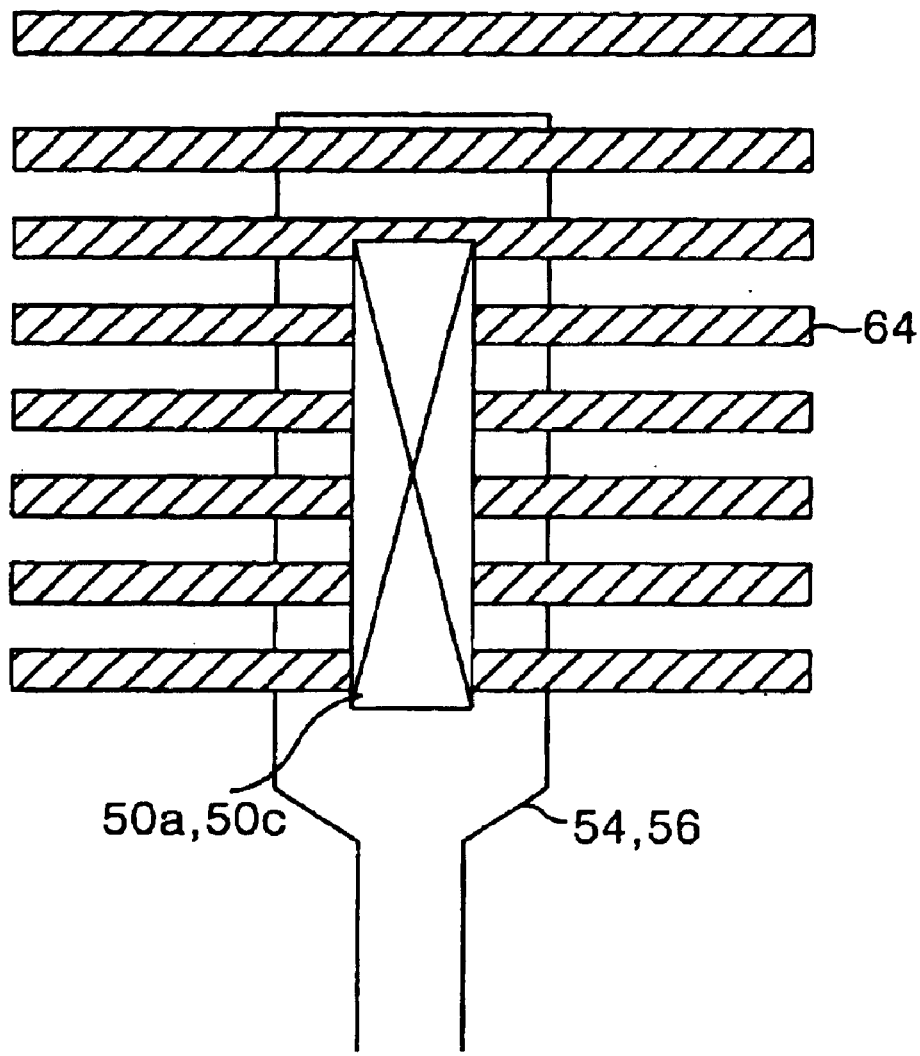
FIG. 7 illustrates examples of masks positioned at the upper portions of the gate pad portion and the data pad portion shown in FIG. 6.

FIG. 7 shows a grating 64 having one or more diffraction parts and a transmission part that are positioned at the gate pad portion GP and the data pad portion DP of the LCD device. This grating 64 is used in a mask which is used to pattern the layers of the LCD device. To accomplish this, the transmission part of the grating 64 is positioned to correspond with an area provided with a gate contact hole 50a over the gate pad 54 and a data contact hole 50c over the data pad 56. The diffraction part of the grating 64 has a relatively small width and is positioned to correspond with an area other than the gate contact hole 50a and the data contact hole 50c. Thus, since the gate pad portion GP and the data pad portion are not provided with the organic protective film 62, the inorganic protective film 48 protects the gate pad portion GP and the data pad portion DP. The TFT of the picture display part TP is protected by the inorganic protective film 48 and the organic protective film 62 for enhancing an aperture ratio.

The organic protective film 62 corresponding to the data pad portion DP and the gate pad portion GP of the LCD device is entirely removed to prevent removal of the gate protective electrode 58 and the data protective electrode 60 caused by a weak adhesion characteristic of the organic protective film 62 upon repetition of the TAB process. Further, an anisotropic conductive film for adhering the gate pad portion GP and the data pad portion DP to the TCP is in direct contact with the inorganic protective film 48 to enhance an adhesive force of the TAB.

FIG. 8A to FIG. 8G show a method of fabricating the LCD device shown in FIG. 6 using a diffraction mask having a grating according to an embodiment of the present invention.

In FIG. 8A, a gate metal layer is deposited on the substrate 31 by a deposition technique such as sputtering. In one embodiment, the gate metal layer is made from at least one of aluminum(Al), copper(Cu), etc. Then, the gate metal layer is patterned by the photolithography including an etching process to provide the gate pad 54 and the gate electrode 36 on the substrate 31.

In FIG. 8B, the gate insulating film 42 is formed on the substrate 31 provided with the gate pad 54 and the gate electrode 36. The gate insulating film 42 is made from an inorganic insulating material such as silicon oxide ($SiO_x$), silicon nitride ($SiN_x$), or silicon oxynitride (SiOxNy). First and second semiconductor layers are continuously deposited on the gate insulating film 42 by a chemical vapor deposition (CVD) technique or other suitable technique. The first semiconductor layer is formed from undoped amorphous silicon. The second semiconductor layer is formed from amorphous silicon doped with an n-type or p-type impurity such as boron, phosphorous, arsenic, etc. Then, the first and second semiconductor layers are patterned by the photolithography including a dry etching process, e.g., plasma etch, to provide an active layer 44 and an ohmic contact layer 46.

In FIG. 8C, a data metal layer is deposited on the gate insulating film 42 provided with the active layer 44 and the ohmic contact layer 46 by a CVD technique, sputtering or any other suitable technique.

The data metal layer is made from, e.g., chromium (Cr), molybdenum (Mo), etc. Then, the data metal layer is patterned by photolithography including a wet etching process to provide the data pad 56, the source electrode 38 and the drain electrode 40. Subsequently, the ohmic contact layer 46 exposed between the source electrode 38 and the drain electrode 40 is removed by a dry etching process or any other suitable process to separate the source electrode 38 and the drain electrode 40. A portion of the ohmic contact layer 40 is removed, and hence a portion corresponding to the gate electrode 36 between the source and drain electrodes 38 and 40 at the active layer 44 makes a channel.

Figure 8D:
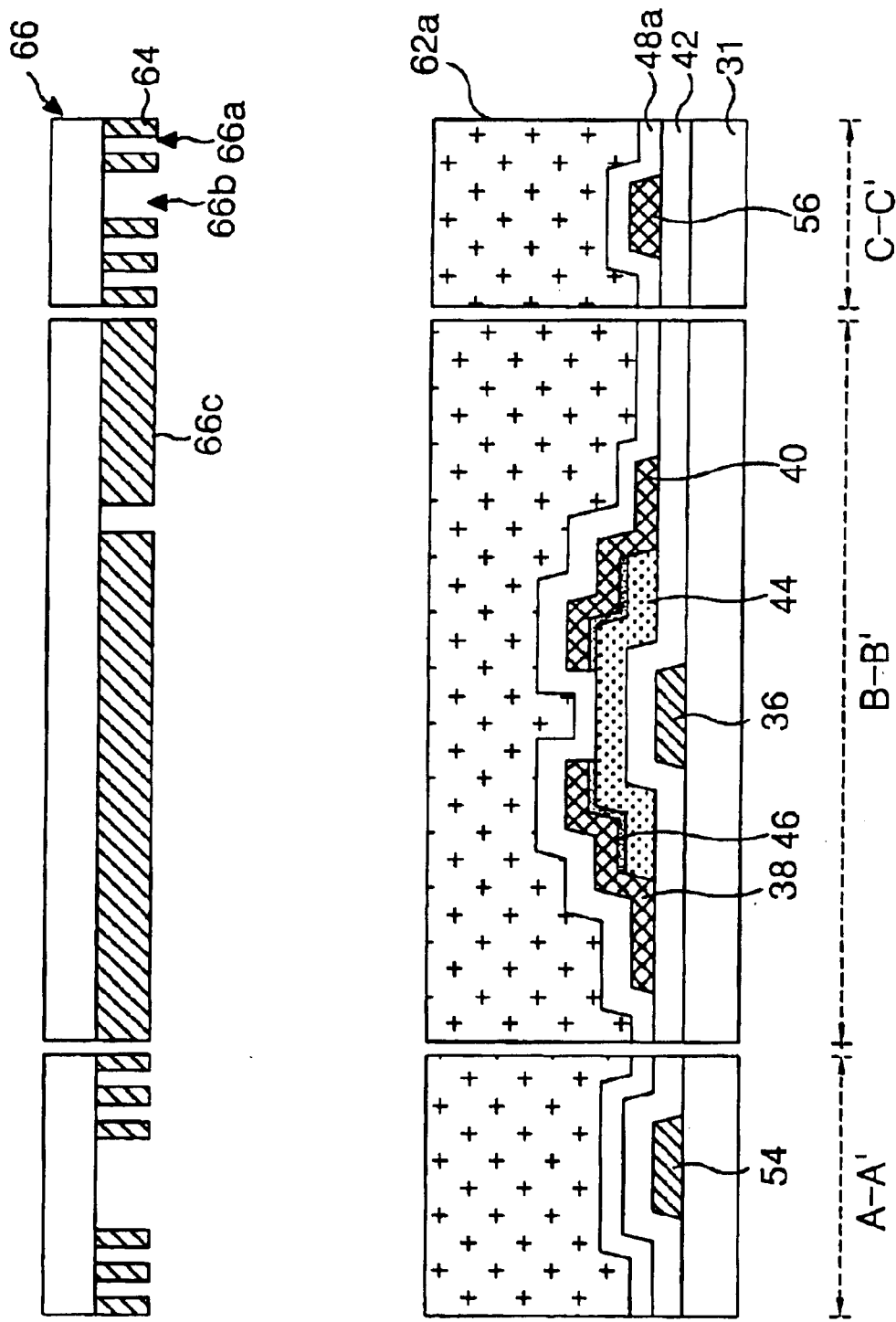

In FIG. 8D, an inorganic insulating layer 48a is formed on the gate insulating film 42 of the substrate 31 provided with the data pad 56, the source electrode 38 and the drain electrode 40. The inorganic insulating layer 48a is made from an inorganic material, preferably from silicon nitride ($SiN_x$).

An organic insulating layer 62a is formed on the substrate 31 provided with the inorganic insulating layer 48a.

The organic insulating layer 62a is made from an organic insulatingmaterial such as an acrylic or methacrylic organic compound, isoprene compound, phenol-formaldehyde resin, benzocyclobutene (BCB) or PFCB (perfluorocyclobutane). In one embodiment, the organic insulating layer 62a is made preferably from acrylic photoresist. The acrylic photoresist can be a negative resist material and can be chemically enhanced.

An example in which acrylic photoresist is used as the organic insulating layer 62a will be described below.

A diffracting mask 66 is positioned at the upper portion of the substrate 31 provided with the acrylic photoresist 62a. The diffracting mask 66 has a grating 64 forming a diffraction part 66a and a transmission part 66b, and a shielding part 66c. The transmission part 66b of the diffraction mask 66 is positioned at an area where a gate contact hole, a data contact hole and a drain contact hole is to be made later. The diffraction part 66a is positioned at an area of the gate pad portion GP and the data pad portion DP excluding the gate contact hole and the data contact hole. The shielding part 66c is positioned at the other area.

In FIG. 8E, the diffracting mask 66 positioned at the upper portion of the substrate 31 is used to expose and develop the acrylic photoresist 62a. The acrylic photoresist 62a is removed from an area corresponding to the transmission part 66b of the diffracting mask 66 by an exposure and development process, thereby exposing portions of the inorganic insulating layer 48a. The acrylic photoresist 62a equal to about 10% to 50% of its initial thickness is left at an area corresponding to the diffraction part 66a while the acrylic photoresist 62a equal to its initial thickness is left at an area corresponding to the shielding part 66c.

In FIG. 8F, according to an embodiment of the present invention, the remaining acrylic photoresist 62a is used as a mask to remove portions of the inorganic insulating layer 48a so as to form contact holes 50b and 50c, and to remove portions of the inorganic insulating layer 48a and the gate insulating film 42 so as to form a contact hole 50a. Thereafter, a certain thickness of the acrylic photoresist 62a is removed, which results in the organic protective film 62 over the TFT region, but not over the gate and data pads 54 and 56. This process produces the inorganic protective film 48, the organic protective film 62, the gate contact hole 50a, the drain contact hole 50b and the data contact hole 50c formed on the substrate 31. Thus, the inorganic protective film 48 is provided at an area other than the gate contact hole 50a, the drain contact hole 50b and the data contact hole 50c, and this area excludes the transmission part 66b of the diffracting mask 66. The organic protective film 62 is formed on the TFT of the picture display part TP, which is an area corresponding to the shielding part 66c of the diffracting mask 66. The gate contact hole 50a, the drain contact hole 50b and the data contact hole 50c are formed at an area corresponding to the transmission part 66b of the diffracting mask 66.

In accordance with another embodiment, instead of completely removing the organic protective film 62 over the gate and data pads 54 and 56 after the contact holes 50a, 50b and 50c are defined, the present invention performs these two steps simultaneously. That is, while the portions of the patterned organic protective film 62 over the gate and data pads 54 and 56 and TFT are being removed (or etched away from the top to bottom), the remaining portions of the patterned organic protective film 62 over the gate and data pads 54 and 56 and TFT are used as a mask to form the contact holes 50a, 50b and 50c. An ashing technique, a dry etching, and/or other known suitable technique may be used in these processes.

In FIG. 8G, a transparent electrode layer is formed on the organic protective film 62 and the inorganic protective film 48 by a deposition technique such as sputtering. The transparent electrode layer is made from indium-tin-oxide (ITO), indium-zinc-oxide (IZO) or indium-tin-zinc-oxide (ITZO), etc. Then, The transparent electrode layer is patterned by photolithography, including an etching process to provide the pixel electrode 52, the gate protective electrode 58 and the data protective electrode 60. The pixel electrode 52 is electrically connected to the drain electrode 40 via the drain contact hole 50b, which passes through the organic protective film 62 and the inorganic protective film 48. The gate protective electrode 58 electrically connects to the gate pad 54 via the gate contact hole 50a, which passes through the gate insulating film 42 and the inorganic protective film 48. The data protective electrode 60 electrically connects to the data pad 56 via the data contact hole 50c, which passes through the inorganic protective film 48.

As described above, according to an embodiment of the invention, the organic protective film of the pad portion is removed by the diffraction and exposure. Accordingly, a removal of the transparent electrode layer caused by a weak adhesion characteristic of the organic protective film upon repetition of the TAB process can be prevented. Hence a damage and an oxidization of the pad portion caused by the removal of the transparent electrode layer can be prevented.

Also, the anisotropic conductive film is in direct contact with the inorganic insulating layer by the entire removal of the organic protective film of the pad portion, so that the adhesive force of the TAB can be enhanced. Furthermore, a repair-effectiveness of the tape carrier package is improved to enhance the yield and productivity.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A method of fabricating a liquid crystal display device, comprising:

forming a gate electrode and a gate pad over a substrate;

forming a gate insulating film over the substrate;

forming a semiconductor layer over the gate insulating film;

forming a source electrode, a drain electrode and a data pad over the gate insulating film;

depositing an inorganic insulating material on the gate insulating film;

depositing an organic insulating material over the inorganic insulating material;

removing selectively the organic insulating material at a partial area over the drain electrode, the gate pad and the data pad, to leave a portion of the organic insulating material over the gate pad and the data pad;

patterning the gate insulating film and the inorganic insulating material using at least a portion of the remaining organic insulating material as a mask, thereby providing an inorganic protective film, an organic protective film, a drain contact hole, a gate contact hole and a data contact hole; and forming a pixel electrode on the inorganic protective film by depositing a transparent conductive film onto the inorganic protective film and the organic protective film and patterning the transparent conductive film, and forming a gate protective electrode and a data protective electrode on the inorganic protective film.

2. The method of claim 1, wherein, in the patterning step, the inorganic insulating material and the organic insulating material are patterned simultaneously.

3. The method of claim 1, wherein the patterning step includes removing a certain thickness of the remaining organic insulating material after the inorganic insulating material has been patterned.

4. The method of claim 1, wherein said inorganic insulating material is silicon nitride.

5. The method of claim 1, wherein said organic insulating material is a photo-sensitive material.

6. The method of claim 5, wherein said photo-sensitive material is acrylic photoresist.

7. The method of claim 1, wherein the step of selectively removing the organic insulating material is performed using a diffracting mask.

8. The method of claim 7, wherein a transmission part of the diffracting mask is positioned in correspondence with the gate contact hole and the drain contact hole, a diffraction part of the diffracting mask is positioned in correspondence with a partial area including the gate pad and the data pad other than the gate contact hole and the data contact hole, and a shielding part of the diffracting mask is positioned in correspondence with an area other than said partial area.

* * * * *